United States Patent
Syverson et al.

[11] Patent Number: 5,458,724
[45] Date of Patent: Oct. 17, 1995

[54] ETCH CHAMBER WITH GAS DISPERSING MEMBRANE

[75] Inventors: Daniel J. Syverson, Robbinsdale; Richard E. Novak; Eugene L. Haak, both of Plymouth, all of Minn.

[73] Assignee: FSI International, Inc., Chaska, Minn.

[21] Appl. No.: 320,494

[22] Filed: Mar. 8, 1989

[51] Int. Cl.$^6$ .................................................. B05C 5/00
[52] U.S. Cl. .................................... 156/345; 156/646.1
[58] Field of Search ..................................... 156/643, 345, 156/646

[56] References Cited

U.S. PATENT DOCUMENTS

| | | | |
|---|---|---|---|
| 4,094,722 | 6/1978 | Yamamoto et al. | 156/345 |
| 4,119,881 | 10/1978 | Calderon | 313/360 |
| 4,134,817 | 1/1979 | Bourdon | 204/192 |
| 4,148,705 | 4/1979 | Battey et al. | 204/192 |
| 4,209,357 | 6/1980 | Gorin et al. | 156/643 |
| 4,230,515 | 10/1980 | Zajec | 156/345 |
| 4,313,783 | 2/1982 | Davies et al. | 156/643 |
| 4,534,816 | 8/1985 | Chen et al. | 156/345 |
| 4,540,466 | 9/1985 | Nishizawa | 156/643 |
| 4,544,446 | 10/1985 | Cady | 156/639 |
| 4,565,601 | 1/1986 | Kakehi et al. | 156/643 |
| 4,579,618 | 4/1986 | Celestino et al. | 156/345 |
| 4,590,042 | 5/1986 | Drage | 422/186 |
| 4,595,484 | 6/1986 | Giammarco et al. | 204/298 |
| 4,600,464 | 7/1986 | Desilets et al. | 156/345 |
| 4,612,077 | 9/1986 | Tracy et al. | 156/345 |
| 4,624,214 | 11/1986 | Suzuki et al. | 118/719 |
| 4,631,105 | 12/1986 | Carroll et al. | 156/345 |
| 4,664,747 | 5/1987 | Sekiguchi et al. | 156/643 |
| 4,749,440 | 6/1988 | Blackwood et al. | 156/646 |
| 4,780,169 | 10/1988 | Stark et al. | 156/345 |
| 4,792,378 | 12/1988 | Rose et al. | 156/345 |
| 4,820,371 | 4/1989 | Rose | 156/345 |
| 4,846,928 | 7/1989 | Dolins et al. | 156/643 |
| 4,857,142 | 8/1989 | Syverson | 156/345 |
| 4,859,277 | 8/1989 | Barna et al. | 156/643 |

FOREIGN PATENT DOCUMENTS 60-137021  7/1985  Japan ........................... 156/345

OTHER PUBLICATIONS

*Laboratory Membrane Filtration,* Millipore Membrane Filtration Technology, date unknown, originating with Millapore Corporation, 80 Ashby Road, Bedford, Massachusetts 01730.

Application SN 020,473, Filed Mar. 2, 1987, Process Chamber for HF Vapor Etching, pp. 1–20.

H. M. Gartner, et al., "Selective Etch Rate Control Technique in Reactive Ion Etching", *IBM Technical Disclosure Bulletin*, vol. 21, No. 3, Aug. 1978, pp. 1032, 1033.

A. Lanzaro, "Individual Wafer Etch–Rate Control in Batch Reactor", *IBM Technical Disclosure Bulletin*, vol. 22, No. 3, Aug. 1979, pp. 1008, 1009.

*Primary Examiner*—Thi Dang
*Attorney, Agent, or Firm*—Palmatier, Sjoquist & Helget

[57] ABSTRACT

Processing gases in an etching chamber for semiconductor wafers are dispersed by a porous plastic membrane interposed between the source of gases and the wafer being processed. A peripheral outlet in the chamber wall exhausting gases is also traversed by a porous plastic membrane.

12 Claims, 1 Drawing Sheet

ETCH CHAMBER WITH GAS DISPERSING MEMBRANE

This invention relates to gaseous processing of semiconductor wafers and more particularly to an improved apparatus for carrying out an etching process through the use of etchant gases.

BACKGROUND OF THE INVENTION

Etching of oxides from semiconductor wafers has traditionally been accomplished through the use of liquid acids and chemicals sprayed onto such wafers but recently the processing of such wafers with the use of etchant gases, such as anhydrous hydrogen fluoride gas, has become known and is successfully used with a high degree of control. The Blackwood U.S. Pat. No. 4,749,440 shows an elementary form of apparatus for accomplishing the gaseous etching of semiconductor wafers, and an improved etching chamber is illustrated in a prior art pending application Ser. No. 020,473, filed Mar. 2, 1987, now abandoned and under common ownership with the present application. This prior art disclosure illustrates a chamber with an apertured diffuser plate providing for ingress of etchant gas to the wafer being etched, and the same plate provided for the discharge of spent gases after having been used for etching the wafer.

SUMMARY OF THE INVENTION

An object of the invention is to provide an improved apparatus controlling the flow of gases used for processing and specifically etching of oxides from semiconductor wafers so as to improve the uniformity of the process of all portions of the surfaces of the wafer.

A feature of the present invention is the provision in a chamber used for applying etchant gases onto the surface of a rotating semiconductor wafer, of a porous plastic membrane confronting the surface of the wafer and having uniformly dispersed pores in the membrane which are extremely small and which are uniformly dispersed over the membrane as to pass the necessary quantities of etchant gas therethrough to be directed onto the surface of the wafer being processed. The membrane may be of polyethylene, PVDF or PTFE or similar plastics which resist the deteriorating effects of strong acids and other chemicals. The pores in the polyethylene membrane have a size in the range of 20 to 50 microns.

Another feature of the invention is to provide for the flow of etchant gas onto the surface of the wafer being etched and then facilitate discharge of the spent gases around the periphery of the enclosing chamber adjacent the edge of the wafer and providing an annular outlet or exhaust for the spent etchant gas, the annular exhaust being entirely covered with the porous plastic membrane which contributes materially to the uniformity of flow around the entire periphery of the chamber and of the wafer rotating therein. The use of the porous membrane for the ingress of etchant gas and for the discharge of the spent etchant gas minimizes the need for rotation of the wafer because of the uniformity of flow of the etchant gas caused by the porous polyethylene membrane.

Still another feature of the invention is a method of interposing a porous plastic membrane between the supply of processing gases and a semiconductor wafer being processed to uniformly disperse the gas across the wafer to cause uniform etching of the oxide thereon.

DETAILED SPECIFICATION

Figure 1:
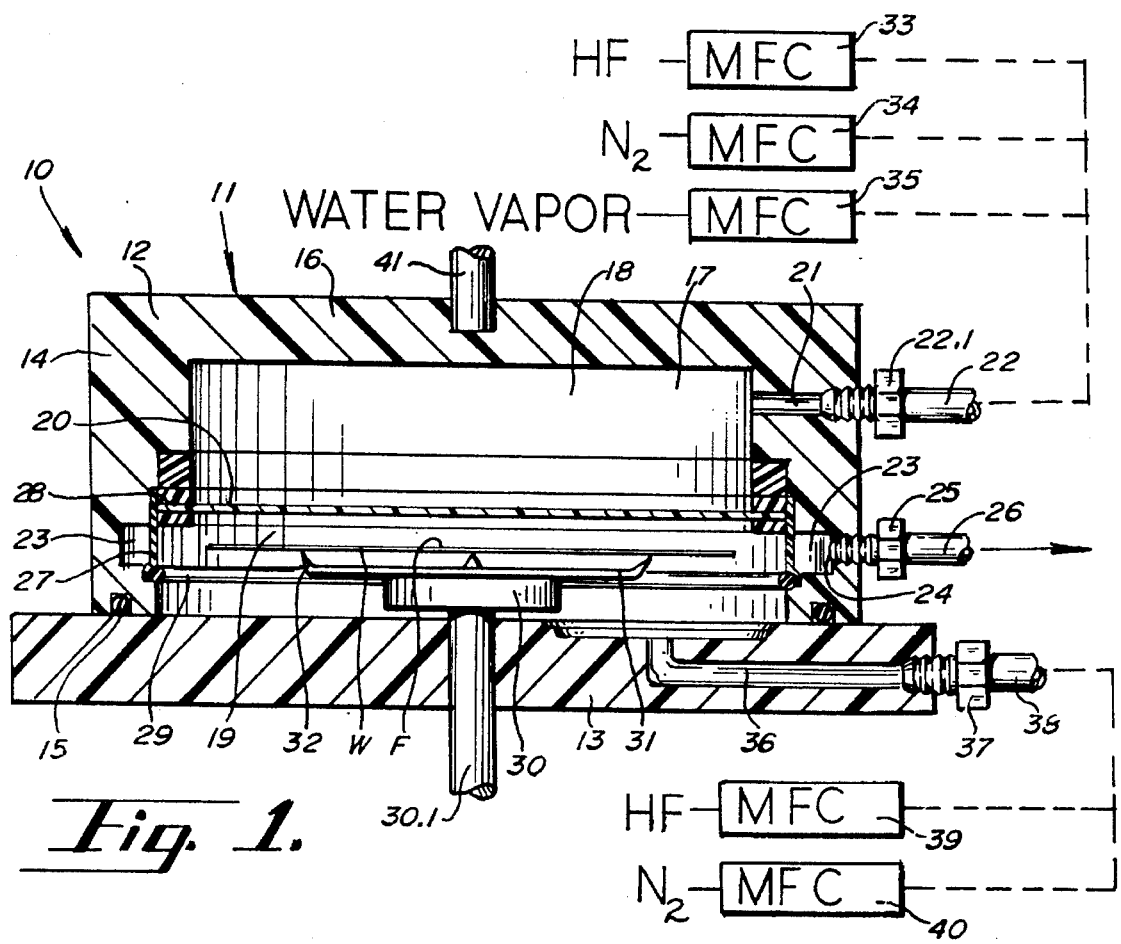
FIG. 1 is a section view on a vertical plane through an etching chamber.
Figure 2:
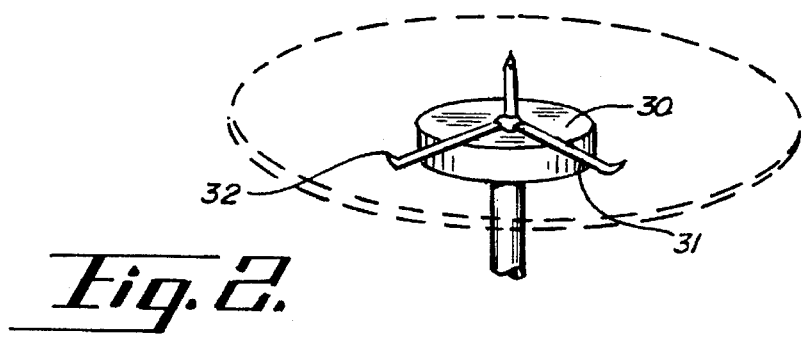
FIG. 2 is a detail perspective view of one form of mounting for carrying and revolving a wafer being processed in the chamber.

One form of the invention is described and illustrated herein.

The processing apparatus is indicated in general by numeral 10.

The apparatus is for the purpose of applying process gases such as etchant gas onto the face F of a semiconductor wafer W which in most cases is formed of silicon. Oxides will exist on the entire face F or on portions thereof and the purpose of the etching is to remove the oxides or portions of the oxides. The oxides on the face of the wafer may vary from one wafer to another, and in certain instances the oxides are natural oxides and in other instances the oxides may be grown on the wafer for particular purposes.

The apparatus 10 includes an enclosure means indicated in general by the numeral 11, and the enclosure means includes a housing 12 and a base wall 13 to which the peripheral sidewall 14 of the housing is sealed as by an 0-ring seal 15. The housing 12 also has a closed top 16 formed integrally of and in one piece with the peripheral sidewall 14. The housing 11 has an open interior defined by the numeral 17 which is divided into separate spaces or chambers 18 and 19 by a diaphragm-shaped membrane 20. The upper chamber 18 is a supply plenum and is supplied with processing gases such as anhydrous hydrogen fluoride, water vapor, and nitrogen from a gas inlet port 21 which is connected to a supply pipe or tube 22 by means of a threaded fitting 22.1. The lower chamber 19 is a processing chamber in which the wafer W is confined.

The peripheral sidewall 14 of the housing has an annular groove 23 around the entire periphery of the open interior 17 and particularly the process chamber 19. The groove 23 opens into an outlet port 24 in the sidewall 14 into which a connector fitting 25 is mounted for attaching a discharge pipe or tube 26. The groove 23 and outlet port 24 cumulatively define the gas outlet for the enclosure means for discharging spent gases from the process chamber 19.

An annular membrane 27 traverses and overlies the inner side of groove 23 around the entire periphery of sidewall 14.

The membranes 20 and 27 are formed of the same identical material which is a porous plastic admitting flow of processing gases therethrough from the supply chamber 18 to the process chamber 19 and thence to the annular groove 23 in such a manner that the flow of gas from the membrane 20 towared the wafer W is uniform entirely across the face F of the wafer. The pores in the membranes 20 and 27 may be approximately 20 to 50 microns in size and are uniformly dispersed across the entire membranes.

The membranes 20 and 27 may be formed of a plastic which is resistant to the deteriorating effects of strong acids such as hydrogen fluoride, and one formed of polyethylene is a preferred form, but may also be formed of other materials such as polyvinylidene difluoride, also known as PVDF. In addition, the membranes may be made of polytetrafluoroethylene, also known as PTFE and by its tradmark Teflon owned by DuPont. Such membrane material is available from from Millapore Corp., 80 Ashby Rd., Bedford, Mass. 01730, under the trade names DURAPURE, FLUOROPORE, and MITEX.

Membrane 20 is substantially flat, diaphragm shaped and substantially circular and is clamped into a mounting ring 28 secured on the inner periphery of the housing sidewall 14. Membrane 20 and wafer W are substially parallel and in confronting relation and spaced from each other from one-eighth to one-half inch and preferably about one-fourth of an inch.

The annular membrane 27 traverses the entire periphery of groove 23 and is clamped in a shallow groove adjacent the outlet groove 23 and is clamped in position by a ring 29 and by the clamping ring 28. Of course other techniques of securing the membranes 20 and 27 in the housing may be used within the scope of this invention.

The wafer W is carried on a rotor 30 which may have radially extending mounting arms 31 with upwardly turned and pointed engagement points 32 upon which the back surface of the wafer W sits. Alternately, the rotor 30 may have a vacuum chuck for holding the wafer in position or the rotor may use other various forms of devices for holding the wafer in place as are well known in the wafer processing art.

The inlet pipe or tube 22 may be connected to mass flow controllers 33, 34 and 35 and to sources of various gaseous chemicals which are to be used in the processing of the wafer W. Such mass flow controllers 33, 34 and 35 and are shown to supply gaseous anhydrous hydrogen fluoride, nitrogen, and water vapor, respectively. Of course valving may be provided for each of the several gases.

It should be recognized that the processing carried out in this apparatus 10 is independent of any plasma type process which has been used in the past for etching oxides from wafers. There is an absence of electrical charges for modifying the gases supplied into the interior 17 of the housing. Preferably the entire enclosure means 11 including the housing 12, base wall 13, rotor 30, arms 31, fittings 22.1, 25, tubes 22, 26, and clampings 28, 29 are formed of Teflon PFA (perfluoroalkoxy) which is an insulating material. Although in some instances stainless steel may be used, no reliance is placed on any electrical conductivity of any of the parts or portions of the enclosure means.

The rotor 30 and its wafer supporting arms, together with the rotary shaft which may be driven by a motor for turning the rotor and wafer at suitable speeds are also formed of plastics which are resistant to the high deterioriating effects of strong acids, or may be formed of such material as stainless steel. The shaft 30.1 of the rotor may be driven at speeds of approximately 100 rpm or the shaft may be driven at speeds somewhat higher than that, or the rotor and wafer may be left stationary according to the present process. The uniform and even distribution of process gases passing through the diaphragm 20 essentially eliminates the need for rotating the wafer during processing.

The membrane 27 at the outlet groove 23 contributes materially to the uniformity of flow of the gases from the periphery of the wafer and to the outlet port 24.

A second inlet for processing gases is provided by inlet port 36 which is connected through fitting 37 to supply tube 38. Mass flow controllers 39 and 40 are connected to sources of gaseous anhydrous fluoride and nitrogen respectively. Port 36 opens through the base wall 13 into chamber 19 at a location behind the wafer mounting arms 31.

The housing 12 is connected to a lifting device or rod 41 which may be connected to a source of mechanical power such as a pneumatic cylinder or hydraulic cylinder to lift housing 12 off base wall 13 for allowing replacement of wafer W.

It will be seen that this apparatus provides an improved method of applying process gases to a semiconductor wafer by supplying the gases through a portion of a porous plastic membrane and onto a portion of the wafer being processed, and collecting the flowing gases from all around the periphery of the portion of the wafer being processed. The collecting of the flowing gases around the periphery of the wafer is also carried out through a portion of a plastic membrane which overlies the peripheral outlet groove in the sidewall of the housing. The gases employed in this method of etching the wafer are preferably anhydrous hydrogen fluoride and a diluent such as nitrogen, but without the use of plasma or electrical charges to modify the characteristics of the gases being used.

It would be seen further that the use of a gas dispersing membrane between the gas supplying chamber and the processing chamber of the apparatus causes the gases to be uniformly applied to the face of the wafer as it travels from the membrane which is essentially flat in shape to the face of the wafer which lies substantially parallel to the membrane.

What is claimed:

1. An apparatus for applying process gases over the face of a semiconductor wafer portion in the manufacture of circuit chips, comprising enclosure means defining an open interior comprising a gas supply plenum portion and a processing portion wherein a wafer portion may be exposed to such process gases, the enclosure means comprising a gas inlet opening into the gas supply plenum portion and a gas outlet opening into said processing portion, a support means in the open interior adjacent said processing portion for carrying such a wafer portion to be processed and exposing a portion of the face of the wafer to the process gases supplied into the processing portion of said open interior, and a first plastic membrane having pores therethrough and dispersed thereacross, said membrane traversing a portion of the open interior between said plenum portion and said processing portion and between the gas inlet and gas outlet and enclosing said processing portion and a portion of the support means and the wafer portion carried thereby, said first membrane confronting the portion of the support means and admitting passage of and dispersing the flow of process gases through the pores and toward and across said wafer portion.

2. An apparatus according to claim 1, wherein the enclosure means has a periphery around the processing portion of the open interior, peripheral means defining said gas outlet around the periphery of said processing portion to receive gases flowing across said portion of the front side of the wafer portion, and a second plastic membrane having pores therethrough and dispersed thereacross, the second membrane extending peripherally of said processing portion and traversing the gas outlet to require process gases to pass therethrough and the second membrane cooperating with the first membrane in obtaining substantially uniformly dispersed flow of process gases onto the wafer portion.

3. A processing chamber for gaseous processing of semiconductor wafer portions, comprising enclosure means having an open interior with a gas supplying plenum portion and a processing portion wherein a portion of such wafer portion may be exposed to process gases, and a plastic membrane having pores therethrough and dispersed thereacross, the pores being in the size range of 20 to 50 microns, the membrane traversing said open interior between the plenum portion and the processing portion and admitting passage and dispersing the flow of such process gases through the pores of the membrane and toward and onto an exposed portion of such a wafer portion.

4. A processing chamber according to claim 3 wherein the enclosure means and membrane means are free of gas modifying electric charges.

5. A processing chamber according to claim 3 wherein the processing portion of the enclosure means has gas outlet means with diverse portions spaced from each other about the periphery of said processing portion and accepting gases flowing in various directions and discharging such gases.

6. The processing chamber according to claim 5 wherein the gas outlet means is substantially annular to encircle the periphery of the wafer portion being processed.

7. The processing chamber according to claim 5 and a second membrane traversing the diverse portions of the outlet means.

8. The processing chamber according to claim 3 and the processing portion of the enclosure means being shaped to accommodate the wafer portion oriented in confronting relation to the membrane.

9. The processing chamber according to claim 3 wherein the membrane is substantially flat to be nearly uniformly spaced from the wafer portion.

10. An apparatus according to claim 1 wherein the support means comprises rotary means for revolving the wafer portion being processed.

11. An apparatus according to claim 2, wherein the pores are uniformly dispersed across the membrane means and are of a size in the range of 20 to 50 microns.

12. A processing chamber for gaseous processing of semiconductor wafer portions, comprising a base wall, a wafer mounting rotor adjacent the base wall to carry and revolve a wafer portion being processed, a housing having a closed top and a peripheral wall sealing against the base wall and encircling the rotor and a wafer portion thereon, the housing having an open interior, a plastic membrane in the housing and having pores therethrough and dispersed thereacross, the membrane traversing said open interior and overlying said rotor to confront the wafer portion thereon in closely spaced relation, the membrane dividing the open interior into a gas supplying plenum adjacent the closed top and a processing space adjacent the rotor, the membrane uniformly dispersing the gas across the wafer as the gas flows through the membrane and pores thereof from the supply plenum, means mounting the membrane on the peirpheral wall of the housing, means defining a gas outlet extending around the peripheral wall and communicating with the processing space to receive and discharge gases flowing from the periphery of the wafer portion, and a second plastic membrane with pores therethrough and dispersed thereacross and traversing said gas outlet around the entire peripheral wall.

\* \* \* \* \*